US008823317B2

(12) United States Patent
Xu et al.

(10) Patent No.: US 8,823,317 B2
(45) Date of Patent: *Sep. 2, 2014

(54) CIRCUITS AND METHODS FOR HEATING BATTERIES IN SERIES USING RESONANCE COMPONENTS IN SERIES

(75) Inventors: Wenhui Xu, Shenzhen (CN); Yaochuan Han, Shenzhen (CN); Wei Feng, Shenzhen (CN); Qinyao Yang, Shenzhen (CN); Wenjin Xia, Shenzhen (CN); Shibin Ma, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 365 days.

This patent is subject to a terminal disclaimer.

(21) Appl. No.: 13/189,114

(22) Filed: Jul. 22, 2011

(65) Prior Publication Data

US 2012/0025756 A1    Feb. 2, 2012

(30) Foreign Application Priority Data

Jul. 30, 2010  (CN) .......................... 2010 1 0245288
Aug. 30, 2010  (CN) .......................... 2010 1 0274785
Dec. 23, 2010  (CN) .......................... 2010 1 0604744

(51) Int. Cl.
*H02J 7/00*    (2006.01)
*H05B 1/00*    (2006.01)
*H01L 23/34*    (2006.01)

(52) U.S. Cl.
CPC ............. *H02J 7/0054* (2013.01); *H02J 7/0091* (2013.01); *H02J 7/0093* (2013.01); *H02J 7/0075* (2013.01); *H01L 23/345* (2013.01)
USPC ........... 320/103; 320/128; 320/129; 320/166; 219/209

(58) Field of Classification Search
CPC ..... H02J 7/0054; H02J 7/0091; H02J 7/0093; H02J 7/0075; H01L 23/345
USPC ................... 320/103, 128, 166, 129; 219/209
See application file for complete search history.

(56) References Cited

U.S. PATENT DOCUMENTS

| | | | |
|---|---|---|---|
| 3,654,426 A | 4/1972 | Brinkmann et al. | |
| 3,808,481 A | 4/1974 | Rippel | |

(Continued)

FOREIGN PATENT DOCUMENTS

| | | |
|---|---|---|
| CN | 1630129 A | 6/2005 |
| CN | 1630130 A | 6/2005 |

(Continued)

OTHER PUBLICATIONS

China Patent Office, Office Action dated Sep. 21, 2011, in related application CN 201010603658.3.

(Continued)

*Primary Examiner* — M'Baye Diao
(74) *Attorney, Agent, or Firm* — Jones Day

(57) ABSTRACT

Circuit and method for heating first and second batteries. The heating circuit includes first and second switch units, first and second damping components, first and second current storage components, switching control module and charge storage component. The first battery, first damping and current storage components, first switch unit and charge storage component are connected in a first loop to form a first charging/discharging circuit. The second battery, second damping and current storage components, charge storage component and second switch unit are connected in a second loop to form a second charging/discharging circuit. When the charge storage component is charged or discharges, charging/discharging current in the second charging/discharging circuit is reverse to that in the first charging/discharging circuit. The switching control module controls the first and second switch units to switch on in alternate, so as to control electric energy flow among the first battery, charge storage component and second battery.

8 Claims, 7 Drawing Sheets

(56) References Cited

U.S. PATENT DOCUMENTS

| | | | |
|---|---|---|---|
| 4,171,508 A * | 10/1979 | Sinclair | 429/120 |
| 4,184,197 A | 1/1980 | Cuk et al. | |
| 4,222,000 A | 9/1980 | Silvertown et al. | |
| 5,362,942 A | 11/1994 | Vanderslice, Jr. et al. | |
| 5,396,165 A * | 3/1995 | Hwang et al. | 323/210 |
| 5,461,556 A | 10/1995 | Horie et al. | |
| 5,768,114 A | 6/1998 | Gruning et al. | |
| 5,789,905 A | 8/1998 | Yamasaki | |
| 5,808,469 A | 9/1998 | Kopera | |
| 5,905,371 A | 5/1999 | Limpaecher | |
| 5,943,224 A | 8/1999 | Mao | |
| 5,948,298 A | 9/1999 | Ijaz | |
| 5,990,661 A | 11/1999 | Ashtiani et al. | |
| 6,002,240 A | 12/1999 | McMahan et al. | |
| 6,072,301 A | 6/2000 | Ashtiani et al. | |
| 6,078,163 A | 6/2000 | Horie et al. | |
| 6,211,652 B1 | 4/2001 | Glasgow | |
| 6,259,229 B1 * | 7/2001 | Ashtiani et al. | 320/128 |
| 6,340,879 B1 | 1/2002 | Bläcker | |
| 6,771,518 B2 | 8/2004 | Orr et al. | |
| 6,882,061 B1 | 4/2005 | Ashtiani et al. | |
| 7,292,010 B2 | 11/2007 | Hsu et al. | |
| 7,382,102 B2 | 6/2008 | Ashtiani | |
| 7,402,982 B2 | 7/2008 | Ito et al. | |
| 7,876,583 B2 | 1/2011 | Polivka et al. | |
| 8,004,866 B2 | 8/2011 | Bucella et al. | |
| 8,197,502 B2 | 6/2012 | Smith et al. | |
| 8,493,036 B2 | 7/2013 | Ferrario | |
| 2005/0077879 A1 * | 4/2005 | Near | 320/166 |
| 2005/0156578 A1 | 7/2005 | Karmenoff | |
| 2005/0168195 A1 | 8/2005 | MacDougall | |
| 2005/0264237 A1 | 12/2005 | Ishizuka | |
| 2007/0024243 A1 | 2/2007 | Liu et al. | |
| 2007/0121258 A1 | 5/2007 | Hachiya | |
| 2009/0014436 A1 | 1/2009 | Toya et al. | |
| 2009/0243547 A1 | 10/2009 | Andelfinger | |
| 2011/0095711 A1 | 4/2011 | Hsieh et al. | |
| 2011/0144861 A1 | 6/2011 | Lakirovich et al. | |
| 2011/0273136 A1 | 11/2011 | Yoshimoto | |
| 2012/0024838 A1 | 2/2012 | Xu et al. | |
| 2012/0025754 A1 | 2/2012 | Xu et al. | |
| 2012/0025755 A1 | 2/2012 | Xu et al. | |
| 2012/0025772 A1 | 2/2012 | Xu et al. | |
| 2012/0025774 A1 | 2/2012 | Xu et al. | |
| 2012/0025775 A1 | 2/2012 | Xu et al. | |
| 2012/0025776 A1 | 2/2012 | Xu et al. | |
| 2012/0025777 A1 | 2/2012 | Xu et al. | |
| 2012/0025778 A1 | 2/2012 | Xu et al. | |
| 2012/0025779 A1 | 2/2012 | Xu et al. | |
| 2012/0025780 A1 | 2/2012 | Xu et al. | |
| 2012/0025781 A1 | 2/2012 | Xu et al. | |
| 2012/0025782 A1 | 2/2012 | Xu et al. | |
| 2012/0025783 A1 | 2/2012 | Xu et al. | |
| 2012/0031890 A1 | 2/2012 | Han et al. | |
| 2012/0032642 A1 | 2/2012 | Xu et al. | |
| 2012/0126753 A1 | 5/2012 | Carkner | |
| 2012/0161711 A1 | 6/2012 | Xu et al. | |
| 2012/0279951 A1 | 11/2012 | Xu et al. | |
| 2012/0280658 A1 | 11/2012 | Xu et al. | |
| 2012/0280659 A1 | 11/2012 | Xu et al. | |
| 2012/0299551 A1 | 11/2012 | Xu et al. | |
| 2012/0306432 A1 | 12/2012 | Xu et al. | |
| 2013/0127398 A1 | 5/2013 | Xu et al. | |
| 2013/0134146 A1 | 5/2013 | Han et al. | |
| 2013/0134945 A1 | 5/2013 | Xu et al. | |
| 2013/0141032 A1 | 6/2013 | Xu et al. | |

FOREIGN PATENT DOCUMENTS

| | | |
|---|---|---|
| CN | 1809942 A | 7/2006 |
| CN | 1836356 A | 9/2006 |
| CN | 1291518 C | 12/2006 |
| CN | 101552479 A | 10/2009 |
| CN | 201397868 Y | 2/2010 |
| CN | 101685971 A | 3/2010 |
| CN | 201435426 Y | 3/2010 |
| CN | 201667552 U | 12/2010 |
| CN | 102055042 A | 5/2011 |
| CN | 102074756 A | 5/2011 |
| CN | 201936966 U | 8/2011 |
| CN | 201936967 U | 8/2011 |
| CN | 201936969 U | 8/2011 |
| CN | 201966300 U | 9/2011 |
| CN | 202009059 U | 10/2011 |
| CN | 202042567 U | 11/2011 |
| CN | 202076380 U | 12/2011 |
| CN | 202103139 U | 1/2012 |
| CN | 202121024 U | 1/2012 |
| CN | 102074755 B | 5/2012 |
| CN | 102074758 B | 6/2012 |
| CN | 102074759 B | 6/2012 |
| CN | 102074753 B | 7/2012 |
| CN | 102074756 B | 7/2012 |
| CN | 102074760 B | 7/2012 |
| CN | 102074762 B | 7/2012 |
| CN | 102074761 B | 9/2012 |
| CN | 102088117 B | 9/2012 |
| CN | 102082306 B | 11/2012 |
| CN | 102088116 B | 11/2012 |
| EP | 0 418 919 A2 | 3/1991 |
| EP | 1 930 922 A2 | 6/2008 |
| JP | 4-12472 | 1/1992 |
| JP | 5022876 A | 1/1993 |
| JP | 2007-166779 A | 6/2007 |
| JP | 4016045 B2 | 12/2007 |
| SU | 813544 B | 3/1981 |
| TW | 220014 B | 2/1994 |
| TW | 269727 B | 2/1996 |
| TW | 344721 B | 11/1998 |
| TW | 200518370 A | 6/2005 |
| TW | 200527793 A | 8/2005 |
| TW | M275625 U | 9/2005 |
| WO | WO 2010/145439 A1 | 12/2010 |

OTHER PUBLICATIONS

China Patent Office, Office Action dated Jul. 27, 2011, in related application CN 201010603717.7.
China Patent Office, Office Action dated Jul. 27, 2011, in related application CN 201010604714.5.
China Patent Office, Office Action dated Sep. 5, 2011, in related application CN 201010606082.6.
China Patent Office, Office Action dated Sep. 21, 2011, in related application CN 201010605772.X.
China Patent Office, Office Action dated Feb. 2, 2012, in related application CN 201010604777.0.
China Patent Office, Office Action dated Sep. 2, 2011, in related application CN 201010604777.0.
China Patent Office, Office Action dated Jan. 9, 2012, in related application CN 201010604729.1.
China Patent Office, Office Action dated Jul. 18, 2011, in related application CN 201010604729.1.
China Patent Office, Office Action dated Dec. 28, 2011, in related application CN 201010603719.6.
China Patent Office, Office Action dated Jul. 28, 2011, in related application CN 201010603719.6.
China Patent Office, Office Action dated Jan. 5, 2012, in related application CN 201010603471.3.
China Patent Office, Office Action dated Jul. 15, 2011, in related application CN 201010603471.3.
China Patent Office, Office Action dated Jul. 27, 2011, in related application CN 201010603414.5.
China Patent Office, Office Action dated Nov. 16, 2011, in related application CN 201010603414.5.
China Patent Office, Office Action dated Aug. 1, 2011, in related application CN 201010603669.1.
China Patent Office, Office Action dated Sep. 15, 2011, in related application CN 201010604677.8.
China Patent Office, Office Action dated Feb. 2, 2012, in related application CN 201010604744.6.

(56) References Cited

OTHER PUBLICATIONS

China Patent Office, Office Action dated Sep. 20, 2011, in related application CN 201010604744.6.
China Patent Office, Office Action dated Oct. 25, 2011, in related application CN 201110080853.7.
China Patent Office, Office Action dated Nov. 1, 2011, in related application CN 201110081219.5.
China Patent Office, Office Action dated Jan. 21, 2012, in related application CN 201110081276.3.
China Patent Office, Office Action dated Jun. 5, 2012, in related application CN 201110081276.3.
China Patent Office, Office Action dated May 16, 2012, in related application CN 201110137264.8.
China Patent Office, Office Action dated Jan. 21, 2012, in related application CN 201110132362.2.
China Patent Office, Office Action dated Jan. 21, 2012, in related application CN 201110134005.X.
China Patent Office, Office Action dated May 2, 2012, in related application CN 201110134005.X.
European Patent Office, Extended European Search Report dated Sep. 13, 2011, in related application EP 11166955.2.
European Patent Office, Extended European Search Report dated Nov. 30, 2011, in related application EP 11166938.8.
European Patent Office, Extended European Search Report dated Dec. 15, 2011, in related application EP 11166941.2.
European Patent Office, Extended European Search Report dated Sep. 16, 2011, in related application EP 11166949.5.
European Patent Office, Extended European Search Report dated Oct. 6, 2011, in related application EP 11166925.5.
European Patent Office, European Search Report dated Sep. 29, 2011, in related application EP 11166958.6.
European Patent Office, Extended European Search Report dated Jan. 25, 2012, in related application EP 11166952.9.
European Patent Office, European Search Report dated Sep. 21, 2011, in related application EP 11166969.3.
European Patent Office, European Search Report dated Sep. 1, 2011, in related application EP 11166903.2.
European Patent Office, Extended European Search Report dated Nov. 8, 2011, in related application EP 11166872.9.
European Patent Office, Extended European Search Report dated Nov. 25, 2011, in related application EP 11166882.8.
European Patent Office, Extended European Search Report dated Nov. 25, 2011, in related application EP 11166897.6.
European Patent Office, Extended European Search Report dated Sep. 6, 2011, in related application EP 11166900.8.
European Patent Office, Extended European Search Report dated Sep. 23, 2011, in related application EP 11166914.9.
European Patent Office, Extended European Search Report dated Nov. 8, 2011, in related application EP 11166920.6.
European Patent Office, Extended European Search Report dated Sep. 27, 2011, in related application EP 11167066.7.
European Patent Office, Extended European Search Report dated Sep. 8, 2011, in related application EP 11166902.4.
European Patent Office, Extended European Search Report dated Oct. 6, 2011, in related application EP 11167128.5.
Patent Cooperation Treaty, International Search Report and Written Opinion, dated Sep. 1, 2011, in related application PCT/CN2011/074449.
Patent Cooperation Treaty, International Search Report and Written Opinion, dated Aug. 18, 2011, in related application PCT/CN2011/074453.
Patent Cooperation Treaty, International Search Report and Written Opinion, dated Aug. 11, 2011, in related application PCT/CN2011/074463.
Patent Cooperation Treaty, International Search Report and Written Opinion, dated Aug. 25, 2011, in related application PCT/CN2011/074458.
Patent Cooperation Treaty, International Search Report and Written Opinion, dated Aug. 11, 2011, in related application PCT/CN2011/074462.
Patent Cooperation Treaty, International Search Report and Written Opinion, dated Aug. 11, 2011, in related application PCT/CN2011/074457.
Patent Cooperation Treaty, International Search Report and Written Opinion, dated Aug. 25, 2011, in related application PCT/CN2011/074459.
Patent Cooperation Treaty, International Search Report and Written Opinion, dated Aug. 18, 2011, in related application PCT/CN2011/074456.
Patent Cooperation Treaty, International Search Report and Written Opinion, dated Aug. 18, 2011, in related application PCT/CN2011/074460.
Patent Cooperation Treaty, International Search Report and Written Opinion, dated Aug. 11, 2011, in related application PCT/CN2011/074433.
Patent Cooperation Treaty, International Search Report and Written Opinion, dated Aug. 18, 2011, in related application PCT/CN2011/074436.
Patent Cooperation Treaty, International Search Report and Written Opinion, dated Aug. 25, 2011, in related application PCT/CN2011/074438.
Patent Cooperation Treaty, International Search Report and Written Opinion, dated Aug. 11, 2011, in related application PCT/CN2011/074440.
Patent Cooperation Treaty, International Search Report and Written Opinion, dated Aug. 25, 2011, in related application PCT/CN2011/074455.
Patent Cooperation Treaty, International Search Report and Written Opinion, dated Aug. 11, 2011, in related application PCT/CN2011/074461.
Patent Cooperation Treaty, International Search Report and Written Opinion, dated Sep. 1, 2011, in related application PCT/CN2011/074531.
Patent Cooperation Treaty, International Search Report and Written Opinion, dated Aug. 18, 2011, in related application PCT/CN2011/074442.
Patent Cooperation Treaty, International Search Report and Written Opinion, dated Jul. 21, 2011, in related application PCT/CN2011/074536.
United States Patent and Trademark Office, Office Action mailed Jul. 16, 2013, in related patent application U.S. Appl. No. 13/166,281.
United States Patent and Trademark Office, Office Action mailed May 31, 2013, in related patent application U.S. Appl. No. 13/168,004.
United States Patent and Trademark Office, Office Action mailed May 22, 2013, in related patent application U.S. Appl. No. 13/168,014.
United States Patent and Trademark Office, Office Action mailed Jul. 5, 2013, in related patent application U.S. Appl. No. 13/170,021.
United States Patent and Trademark Office, Office Action mailed Jul. 30, 2013, in related patent application U.S. Appl. No. 13/166,301.
United States Patent and Trademark Office, Office Action mailed Sep. 5, 2013, in related patent application U.S. Appl. No. 13/189,096.
United States Patent and Trademark Office, Office Action mailed Aug. 29, 2013, in related patent application U.S. Appl. No. 13/187,874.
United States Patent and Trademark Office, Office Action mailed Sep. 30, 2013, in related patent application U.S. Appl. No. 13/170,044.
United States Patent and Trademark Office, Office Action mailed Jun. 19, 2013, in related patent application U.S. Appl. No. 13/187,890.
United States Patent and Trademark Office, Office Action mailed Nov. 20, 2013, in related patent application U.S. Appl. No. 13/168,004.
United States Patent and Trademark Office, Office Action mailed Nov. 22, 2013, in related patent application U.S. Appl. No. 13/168,014.
United States Patent and Trademark Office, Final Office Action mailed Feb. 25, 2014, in related patent application U.S. Appl. No. 13/170,021.
United States Patent and Trademark Office, Office Action mailed Jan. 6, 2014, in related patent application U.S. Appl. No. 13/187,266.

(56) References Cited

OTHER PUBLICATIONS

United States Patent and Trademark Office, Office Action mailed Jan. 3, 2014, in related patent application U.S. Appl. No. 13/184,906.
United States Patent and Trademark Office, Office Action mailed Dec. 3, 2013, in related patent application U.S. Appl. No. 13/187,279.
United States Patent and Trademark Office, Office Action mailed Dec. 4, 2013, in related patent application U.S. Appl. No. 13/187,890.
United States Patent and Trademark Office, Office Action mailed Jan. 6, 2014, in related patent application U.S. Appl. No. 13/541,487.
United States Patent and Trademark Office, Office Action mailed Dec. 4, 2013, in related patent application U.S. Appl. No. 13/748,525.
United States Patent and Trademark Office, Office Action mailed Jan. 15, 2014, in related patent application U.S. Appl. No. 13/749,480.
United States Patent and Trademark Office, Notice of Allowance mailed Dec. 5, 2013, in related patent application U.S. Appl. No. 13/166,281.
United States Patent and Trademark Office, Notice of Allowance mailed Nov. 8, 2013, in related patent application U.S. Appl. No. 13/166,301.
United States Patent and Trademark Office, Notice of Allowance mailed Jan. 6, 2014, in related patent application U.S. Appl. No. 13/189,096.
United States Patent and Trademark Office, Notice of Allowance mailed Jan. 6, 2014, in related patent application U.S. Appl. No. 13/187,874.
Taiwan Intellectual Property Office, Office Action dated Jan. 10, 2014, in related application TW 100143128.
Taiwan Intellectual Property Office, Office Action dated Jan. 10, 2014, in related application TW 100143130.
Taiwan Intellectual Property Office, Office Action dated Jan. 10, 2014, in related application TW 100143133.
Taiwan Intellectual Property Office, Office Action dated Jan. 7, 2014, in related application TW 100140587.
Taiwan Intellectual Property Office, Office Action dated Jan. 6, 2014, in related application TW 100140588.
Taiwan Intellectual Property Office, Office Action dated Feb. 17, 2014, in related application TW 100143160.
Taiwan Intellectual Property Office, Office Action dated Jan. 6, 2014, in related application TW 100140590.
Taiwan Intellectual Property Office, Office Action dated Jan. 17, 2014, in related application TW 100141797.
Taiwan Intellectual Property Office, Office Action dated Jan. 17, 2014, in related application TW 100141802.
United States Patent and Trademark Office, Office Action mailed Jun. 10, 2014, in related U.S. Appl. No. 13/168,004.
United States Patent and Trademark Office, Office Action mailed Jun. 18, 2014, in related U.S. Appl. No. 13/168,014.
United States Patent and Trademark Office, Office Action mailed Jun. 16, 2014, in related U.S. Appl. No. 13/184,879.
United States Patent and Trademark Office, Office Action mailed Jun. 20, 2014, in related U.S. Appl. No. 13/184,894.
United States Patent and Trademark Office, Office Action mailed Jun. 25, 2014, in related U.S. Appl. No. 13/187,266.
United States Patent and Trademark Office, Office Action mailed Jun. 24, 2014, in related U.S. Appl. No. 13/184,906.
United States Patent and Trademark Office, Office Action mailed Jun. 17, 2014, in related U.S. Appl. No. 13/185,744.
United States Patent and Trademark Office, Office Action mailed Jun. 16, 2014, in related U.S. Appl. No. 13/184,915.
United States Patent and Trademark Office, Office Action mailed Jun. 24, 2014, in related U.S. Appl. No. 13/187,279.
United States Patent and Trademark Office, Office Action mailed Jun. 13, 2014, in related U.S. Appl. No. 13/185,756.
United States Patent and Trademark Office, Office Action mailed Jul. 7, 2014, in related U.S. Appl. No. 13/187,890.
United States Patent and Trademark Office, Office Action mailed Jun. 25, 2014, in related U.S. Appl. No. 13/541,487.
United States Patent and Trademark Office, Office Action mailed Jun. 26, 2014, in related U.S. Appl. No. 13/748,525.
United States Patent and Trademark Office, Office Action mailed Jun. 24, 2014, in related U.S. Appl. No. 13/749,480.
United States Patent and Trademark Office, Notice of Allowance mailed Apr. 25, 2014, in related U.S. Appl. No. 13/166,281.
United States Patent and Trademark Office, Notice of Allowance mailed Jun. 24, 2014, in related U.S. Appl. No. 13/170,021.
United States Patent and Trademark Office, Notice of Allowance mailed May 2, 2014, in related U.S. Appl. No. 13/166,301.
United States Patent and Trademark Office, Notice of Allowance mailed Jun. 18, 2014, in related U.S. Appl. No. 13/189,096.
United States Patent and Trademark Office, Notice of Allowance mailed May 8, 2014, in related U.S. Appl. No. 13/187,874.
United States Patent and Trademark Office, Notice of Allowance mailed May 22, 2014, in related U.S. Appl. No. 13/170,044.

* cited by examiner

CIRCUITS AND METHODS FOR HEATING BATTERIES IN SERIES USING RESONANCE COMPONENTS IN SERIES

1. CROSS-REFERENCE TO RELATED APPLICATIONS

This application claims priority to Chinese Patent Application No. 201010245288.0, filed Jul. 30, 2010, Chinese Patent Application No. 201010274785.3, filed Aug. 30, 2010, and Chinese Patent Application No. 201010604744.6, filed Dec. 23, 2010, all these three applications being incorporated by reference herein for all purposes.

Additionally, this application is related to International Application Publication No. WO2010/145439A1 and Chinese Application Publication No. CN102055042A, both these two applications being incorporated by reference herein for all purposes.

2. BACKGROUND OF THE INVENTION

The present invention pertains to electric and electronic field, in particular related to a battery heating circuit.

Considering cars need to run under complex road conditions and environmental conditions or some electronic devices are used under harsh environmental conditions, the battery, which serves as the power supply unit for electric-motor cars or electronic devices, need to be adaptive to these complex conditions. In addition, besides these conditions, the service life and charge/discharge cycle performance of the battery need to be taken into consideration; especially, when electric-motor cars or electronic devices are used in low temperature environments, the battery needs to have outstanding low-temperature charge/discharge performance and higher input/output power performance.

Usually, under low temperature conditions, the resistance of the battery will increase, and so will the polarization; therefore, the capacity of the battery will be reduced.

To keep the capacity of the battery and improve the charge/discharge performance of the battery under low temperature conditions, some embodiments of the present invention provide a battery heating circuit.

3. BRIEF SUMMARY OF THE INVENTION

The objective of certain embodiments of the present invention is to provide a battery heating circuit, in order to solve the problem of decreased capacity of the battery caused by increased resistance and polarization of the battery under low temperature conditions.

Certain embodiments of the present invention provide a battery heating circuit, wherein: the battery comprises a first battery and a second battery, the heating circuit comprises a first switch unit, a second switch unit, a damping component R1, a damping component R2, a current storage component L1, a current storage component L2, a switching control module and a charge storage component C, the first battery, damping component R1, current storage component L1, first switch unit and charge storage component C are connected in series to form a first charging/discharging circuit; the second battery, damping component R2, current storage component L2, charge storage component C and second switch unit are connected in series to form a second charging/discharging circuit; when the charge storage component C is charged or discharges, the direction of charging/discharging current in the second charging/discharging circuit is reverse to the direction of charging/discharging current in the first charging/discharging circuit; the switching control module is electrically connected with the first switch unit and second switch unit, and is configured to control the first switch unit and second switch unit to switch on in alternate, so as to control the electric energy to flow between the first battery, charge storage component C and second battery.

In the heating circuit provided in certain embodiments of the present invention, the first switch unit and second switch unit can be controlled by the switching control module to switch on in alternate, so that the electric energy can flow back-and-forth between the first battery, charge storage component C and second battery in alternate, and thereby causes the damping component R1 and damping component R2 to generate heat, so as to heat up the first battery and second battery. Since the direction of charging/discharging current in the second charging/discharging circuit is reverse to the direction of charging/discharging current in the first charging/discharging circuit when viewed from the aspect of the charge storage component C, the energy charged from the first battery into the charge storage component C can be transferred successfully to the second battery, so that the heating efficiency is improved.

In the heating circuit provided in certain embodiments of the present invention, the charge storage component is connected with the battery in series; when the battery is heated, safety problems related with failure or short circuit of the switch unit can be avoided owing to the existence of the charge storage component, and therefore the battery can be protected effectively.

Other characteristics and advantages of the present invention will be further described in detail in the following section for embodiments.

4. BRIEF DESCRIPTION OF THE DRAWINGS

The accompanying drawings, as a part of this description, are provided here to facilitate further understanding of the present invention, and are used in conjunction with the following embodiments to explain the present invention, but shall not be comprehended as constituting any limitation on the present invention. In the figures.

5. DETAILED DESCRIPTION OF THE INVENTION

Figure 1:
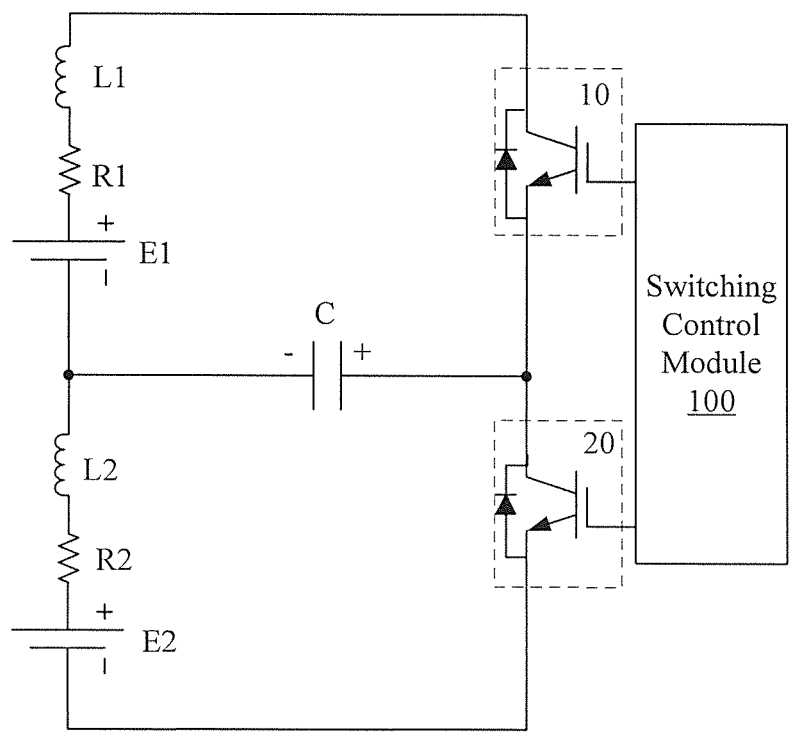
FIG. 1 is a schematic diagram of the heating circuit in the first embodiment of the present invention.

Certain embodiments of the present invention are described in detail below, with reference to the accompanying drawings. It should be appreciated that the embodiments described here are only provided to describe and explain the present invention, but shall not be deemed as constituting any limitation on the present invention.

It is noted that, unless otherwise specified, when mentioned hereafter in this description, the term "switching control module" may refer to any controller that can output control commands (e.g., pulse waveforms) under preset conditions or at preset times and thereby control the switch unit connected to it to switch on or switch off accordingly, according to some embodiments. For example, the switching control module can be a PLC. Unless otherwise specified, when mentioned hereafter in this description, the term "switch" may refer to a switch that enables ON/OFF control by using electrical signals or enables ON/OFF control on the basis of the characteristics of the component according to certain embodiments. For example, the switch can be either a one-way switch (e.g., a switch composed of a two-way switch and a diode connected in series, which can be conductive in one direction) or a two-way switch (e.g., a Metal Oxide Semiconductor Field Effect Transistor (MOSFET) or an IGBT with an anti-parallel freewheeling diode). Unless otherwise specified, when mentioned hereafter in this description, the term "two-way switch" may refer to a switch that can be conductive in two directions, which can enable ON/OFF control by using electrical signals or enable ON/OFF control on the basis of the characteristics of the component according to some embodiments. For example, the two-way switch can be a MOSFET or an IGBT with an anti-parallel freewheeling diode. Unless otherwise specified, when mentioned hereafter in this description, the term "one-way semiconductor component" may refer to a semiconductor component that can be conductive in one direction, such as a diode, according to certain embodiments. Unless otherwise specified, when mentioned hereafter in this description, the term "charge storage component" may refer to any device that can enable charge storage, such as a capacitor, according to some embodiments. Unless otherwise specified, when mentioned hereafter in this description, the term "current storage component" may refer to any device that can store current, such as an inductor, according to certain embodiments. Unless otherwise specified, when mentioned hereafter in this description, the term "forward direction" may refer to the direction in which the energy flows from the battery to the energy storage circuit, and the term "reverse direction" may refer to the direction in which the energy flows from the energy storage circuit to the battery, according to some embodiments. Unless otherwise specified, when mentioned hereafter in this description, the term "battery" may comprise primary battery (e.g., dry battery or alkaline battery, etc.) and secondary battery (e.g., lithium-ion battery, nickel-cadmium battery, nickel-hydrogen battery, or lead-acid battery, etc.), according to certain embodiments. Unless otherwise specified, when mentioned hereafter in this description, the term "damping component" may refer to any device that inhibits current flow and thereby enables energy consumption, such as a resistor, etc., according to some embodiments. Unless otherwise specified, when mentioned hereafter in this description, the term "main loop" may refer to a loop composed of battery, damping component, switch unit and energy storage circuit connected in series according to certain embodiments.

It should be noted specially that, considering different types of batteries have different characteristics, in some embodiments of the present invention, "battery" may refer to an ideal battery that does not have internal parasitic resistance and parasitic inductance or has very low internal parasitic resistance and parasitic inductance, or may refer to a battery pack that has internal parasitic resistance and parasitic inductance; therefore, those skilled in the art should appreciate that if the battery is an ideal battery that does not have internal parasitic resistance and parasitic inductance or has very low internal parasitic resistance and parasitic inductance, the damping component R1 may refer to a damping component external to the battery and the current storage component L1 may refer to a current storage component external to the battery; if the battery is a battery pack that has internal parasitic resistance and parasitic inductance, the damping component R1 may refer to a damping component external to the battery or refer to the parasitic resistance in the battery pack, and the current storage component L1 may refer to a current storage component external to the battery or refer to the parasitic inductance in the battery pack, according to certain embodiments.

To ensure the normal service life of the battery, according to some embodiments, the battery can be heated under low temperature condition, which is to say, when the heating condition is met, the heating circuit is controlled to start heating for the battery; when the heating stop condition is met, the heating circuit is controlled to stop heating, according to certain embodiments.

In the actual application of battery, the battery heating condition and heating stop condition can be set according to the actual ambient conditions, to ensure normal charge/discharge performance of the battery, according to some embodiments.

FIG. 1 is a schematic diagram of the heating circuit in the first embodiment of the present invention. As shown in FIG. 1, one embodiment of the present invention provides a battery heating circuit, wherein: the battery comprises a first battery E1 and a second battery E2, the heating circuit comprises a first switch unit 10, a second switch unit 20, a damping component R1, a damping component R2, a current storage component L1, a current storage component L2, a switching control module 100 and a charge storage component C; the first battery E1, damping component R1, current storage component L1, first switch unit 10 and charge storage component C are connected in series to form a first charging/discharging circuit; the second battery E2, damping component R2, current storage component L2, charge storage component C and second switch unit 20 are connected in series to form a second charging/discharging circuit; when the charge storage component C is charged or discharges, the direction of charging/discharging current in the second charging/discharging circuit is reverse to the direction of charging/discharging current in the first charging/discharging circuit; the switching control module 100 is electrically connected with the first switch unit 10 and second switch unit 20, and is configured to control the first switch unit 10 and second switch unit 20 to switch on in alternate, so as to control the electric energy flow between the first battery E1, charge storage component C and second battery E2.

Wherein: the switching control module 100 can control the first switch unit 10 and second switch unit 20 to switch on or off, for example, the first switch unit 10 switches from ON state to OFF state, while the second switch unit 20 switches from OFF state to ON state, so that the electric energy stored in the charge storage component C from one battery can flow into the other battery. As the electric energy flows, current is generated; by keeping current flowing through the damping component R1 and damping component R2 continuously, the damping component R1 and damping component R2 generate heat, and thereby heat up the first battery E1 and second battery E2.

Figure 2:
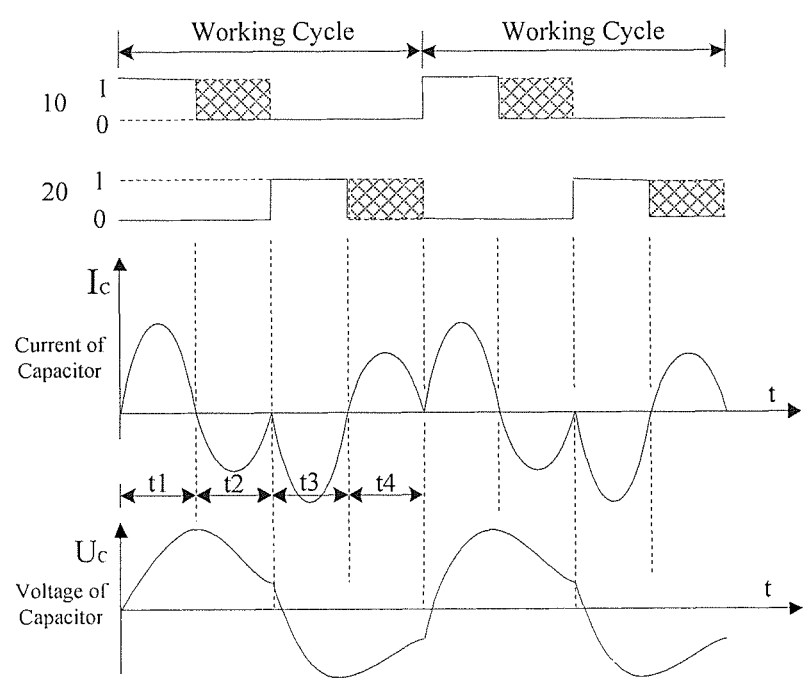
FIG. 2 is a timing sequence diagram of waveform of the heating circuit in the first embodiment of the present invention.

FIG. 2 is a timing sequence diagram of waveform of the heating circuit in the first embodiment of the present invention. Hereunder the working process of the heating circuit provided in one embodiment of the present invention will be described, with reference to FIG. 2. First, the switching control module 100 controls the first switch unit 10 to switch on, and controls the second switch unit 20 to switch off; the first battery E1, damping component R1, current storage component L1, first switch unit 10 and charge storage component C form a charging/discharging circuit, which performs charging/discharging operations (as indicated by the time period t1~t2 shown in FIG. 2, wherein: the time period t1 represents the charging time period of the charging/discharging circuit; at the end of the time period t1, the capacitive voltage $U_C$ of the charge storage component C is the peak value in half cycle, and the capacitive current $I_C$ reaches zero after the positive half cycle; the time period t2 represents the discharging time period of the charging/discharging circuit). After a charging/discharging cycle is completed (at this point, the current $I_C$ through the charge storage component C reaches zero after the negative half cycle), the switching control module 100 controls the first switch unit 10 to switch off, and controls the second switch unit 20 to switch on; the second battery E2, damping component R2, current storage component L2, charge storage component C, and second switch unit 20 form a charging/discharging circuit, which performs charging/discharging operations (as indicated by the time period t3~t4 shown in FIG. 2, wherein: the time period t3 represents the charging time period of the charging/discharging circuit, while the time period t4 represents the discharging time period of the charging/discharging circuit). After the charging/discharging circuit completes a charging/discharging cycle (at this point, the current $I_C$ through charge storage component C reaches zero after the positive half cycle, and the entire heating circuit accomplishes a complete working cycle), the switching control module 100 controls the first switch unit 10 to switch on and controls the switch unit 20 to switch off again; in that way, the cycles continue on, so that the current flows through the damping component R1 and damping component R2 continuously; as a result, the damping component R1 and damping component R2 generate heat, and thereby heat up the first battery E1 and second battery E2 to the expected condition.

In the above working process of the heating circuit provided in certain embodiments of the present invention, the current can be kept flowing back-and-forth between the first battery E1 and the second battery E2, so that two batteries are heated up in alternate, and therefore the heating efficiency is improved.

Figure 3:
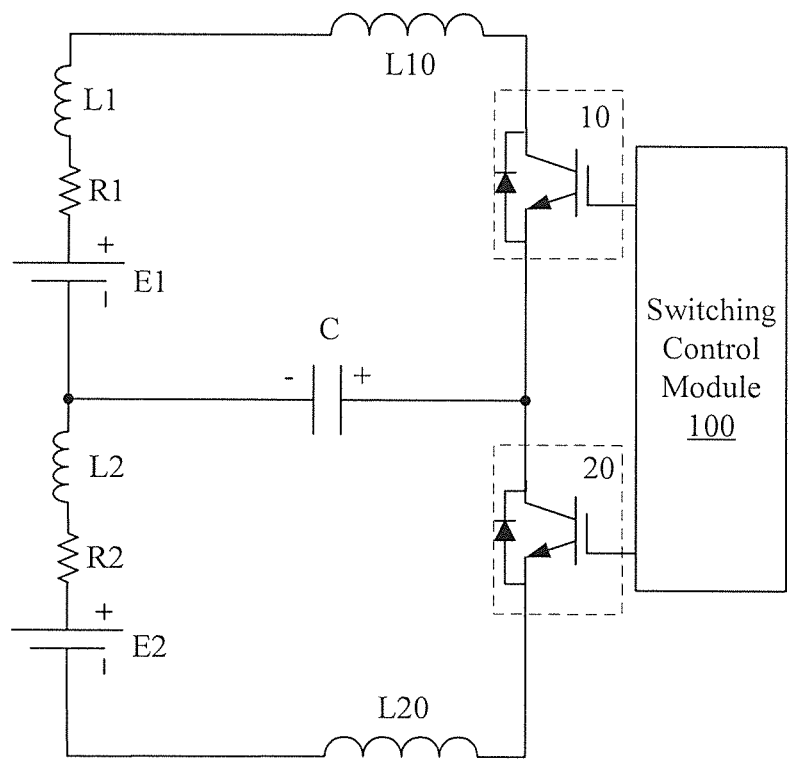
FIG. 3 is a schematic diagram of the heating circuit in the second embodiment of the present invention.
Figure 4:
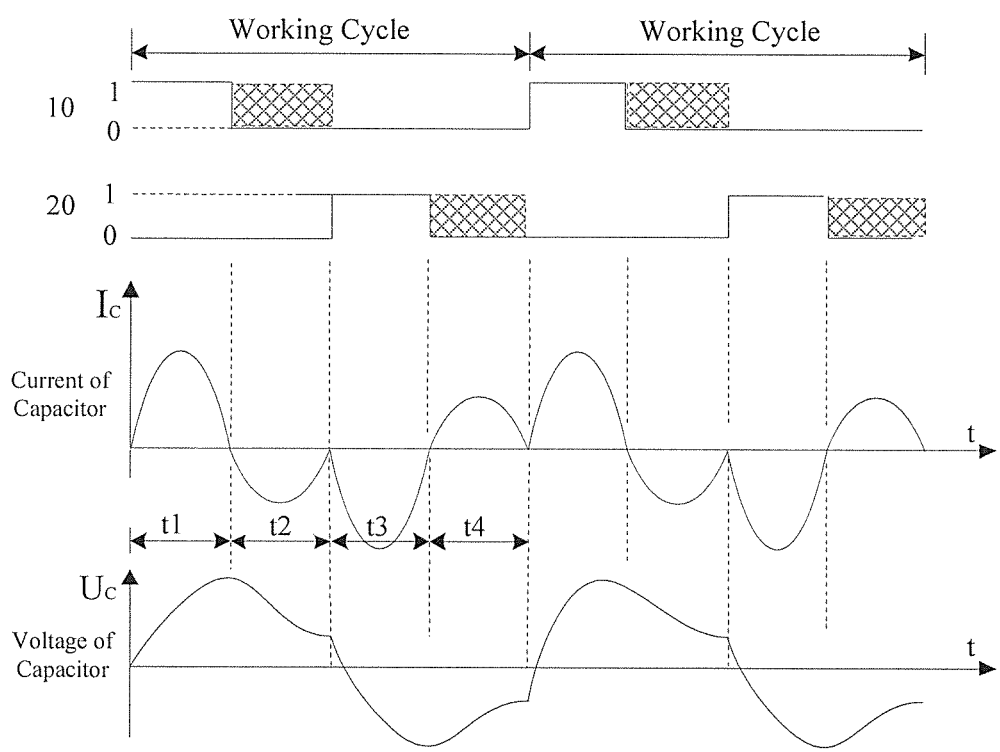
FIG. 4 is a timing sequence diagram of waveform of the heating circuit in the second embodiment of the present invention.

FIG. 3 is a circuit diagram of the heating circuit in the second embodiment of the present invention. Preferably, as shown in FIG. 3, the heating circuit provided in one embodiment of the present invention further comprises a current storage component L10 and a current storage component L20, wherein: the current storage component L10 is connected in series in the first charging/discharging circuit, and the current storage component L20 is connected in series in the second charging/discharging circuit. Thereby, the current storage component L10 and current storage component L20 can be utilized to implement current limiting for the capacitive current $I_C$ (i.e., the current flow through the first and second batteries and the first and second switch units) in both directions, so as to decrease the magnitude of current flowing through the first and second batteries and the first and second switch units, and attain the purpose of protecting the first and second batteries and the first and second switch units. FIG. 4 is a timing sequence diagram of waveform of the heating circuit in the second embodiment of the present invention. As shown in FIG. 4, compared to the capacitive current $I_C$ shown in FIG. 2, the capacitive current $I_C$ shown in FIG. 4 has a smoother waveform, with peak value and valley value much smaller than the peak value and valley value of the capacitive current $I_C$ shown in FIG. 2.

Figure 5:
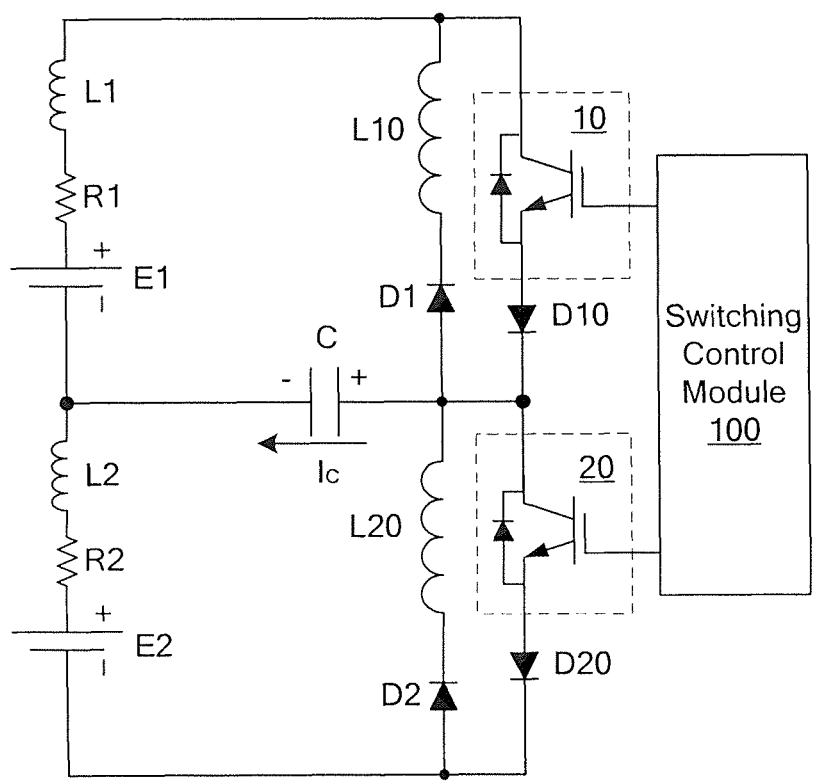
FIG. 5 is a schematic diagram of the heating circuit in the third embodiment of the present invention.
Figure 6:
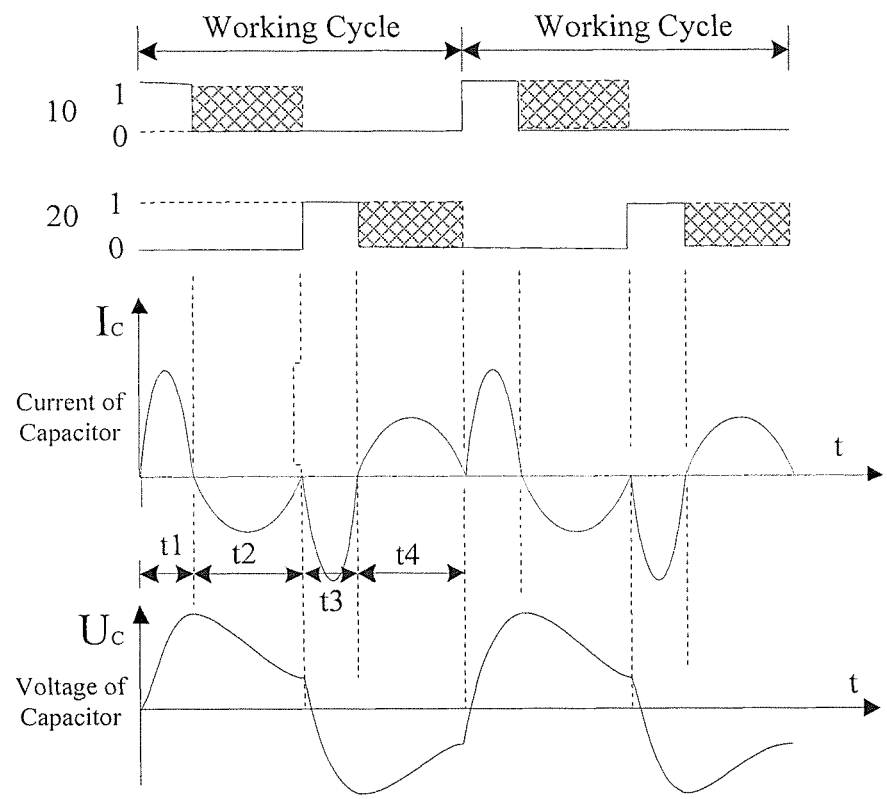
FIG. 6 is a timing sequence diagram of waveform of the heating circuit in the third embodiment of the present invention.

FIG. 5 is a circuit diagram of the heating circuit in the third embodiment of the present invention. Preferably, as shown in FIG. 5, the heating circuit provided in one embodiment of the present invention can further comprise a current storage component L10, a current storage component L20, a one-way semiconductor component D1, a one-way semiconductor component D2, a one-way semiconductor component D10 and a one-way semiconductor component D20, wherein: the one-way semiconductor component D10 is connected in series with the first switch unit 10, the current storage component L10 and one-way semiconductor component D1 connected in series with each other are connected in parallel between the ends of the one-way semiconductor component D10 and first switch unit 10 connected in series with each other, so as to limit the current in the first charging/discharging circuit in reverse direction; and, the one-way semiconductor component D20 is connected in series with the second switch unit 20, and the current storage component L20 and one-way semiconductor component D2 connected in series with each other are connected in parallel between the ends of the one-way semiconductor component D20 and second switch unit 20 connected in series with each other, so as to limit the current in the second charging/discharging circuit in reverse direction. Thereby, the capacitive current (i.e., current flowing through the first battery E1 and second battery E2) is limited in one direction (i.e., current limiting during charging of the first battery E1 and second battery E2). Thus, compared to the heating circuit (two-way current limiting) in the second embodiment, the heating circuit here can further improve the heating efficiency on the premise of protecting the first and second batteries and the first and second switch units. FIG. 6 is a timing sequence diagram of waveform of the heating circuit in the third embodiment of the present invention. As shown in FIG. 6, compared to the capacitive current $I_C$ shown in FIG. 4, the capacitive current $I_C$ shown in FIG. 6 has a higher peak value in the positive half cycle.

Figure 7:
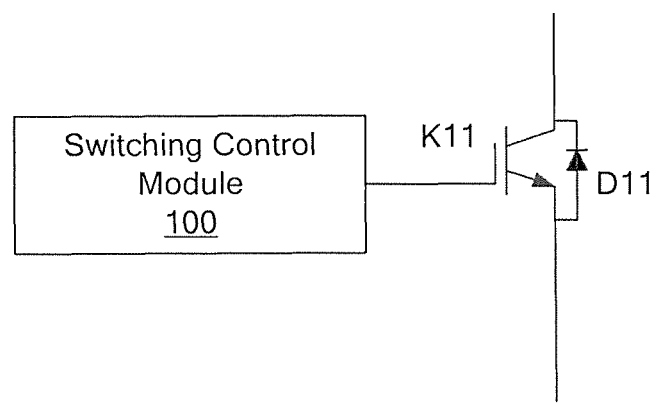
FIG. 7 is a circuit diagram of one embodiment of the first and/or second switch unit in the heating circuit provided in the present invention.

FIG. 7 is a circuit diagram of one embodiment of the switch unit in the heating circuit provided in the present invention. As shown in FIG. 7, the first switch unit 10 and/or the second switch unit 20 can comprise a switch K11 and a one-way semiconductor component D11 connected in parallel with the switch K11 in reverse direction, wherein: the switching control module 100 is electrically connected with the switch K11, and is configured to control ON/OFF of the forward direction branches of the first switch unit 10 and/or the second switch unit 20 by controlling ON/OFF of the switch K11. The ON/OFF control of switch K11 can be performed in the grid zone shown in FIG. 2, FIG. 4 and FIG. 6. When or after the current flow through the first switch unit 10 or the second switch unit 20 reaches zero, the switching control module 100 can control the first switch unit 10 or second switch unit 20 to switch off.

The heating circuit provided in certain embodiments of the present invention has the following advantages:

(1) When viewed from the aspect of the charge storage component, the direction of charging/discharging current in the second charging/discharging circuit is reverse to the direction of charging/discharging current in the first charging/discharging circuit; therefore, the electric energy can flow back-and-forth between the first battery, charge storage component and second battery in alternate, and thereby the resultant current causes the damping component R1 and damping component R1 to generate heat, so that the first and second batteries are heated up; in that way, the first and second batteries are heated in alternate, and the heating efficiency is high;

(2) Since the current storage component provides current limiting function and only one charging/discharging circuit is formed in each time cycle, the current flowing through the first and second batteries and the current flowing through the first and second switch units are lower; in addition, owing to the composition of the charging/discharging circuit and the existence of the current storage component L10 and L20, the current flowing through the first and second batteries and the current flowing through the first and second switch units can be further limited, so as to avoid damage to the batteries and switch units resulted from heavy current;

(3) With the one-way current limiting scheme, the discharging efficiency of the first and second batteries is improved, and the charging current in reverse direction is limited to prevent damage to the first and second batteries; therefore, the heating efficiency can be improved on the premise of protecting the first and second batteries and the switch units against damage; and/or (4) In the heating circuit provided in some embodiments of the present invention, the charge storage component is connected with the battery in series; when the battery is heated, safety problems related with failure or short circuit of the switch unit can be avoided owing to the existence of the charge storage component, and therefore the battery can be protected effectively.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits.

While some embodiments of the present invention are described above with reference to the accompanying drawings, the present invention is not limited to the details of those embodiments. Those skilled in the art can make modifications and variations, without departing from the spirit of the present invention. However, all these modifications and variations shall be deemed as falling into the scope of the present invention.

In addition, it should be noted that the specific technical features described in the above embodiments can be combined in any appropriate way, provided that there is no conflict. To avoid unnecessary repetition, certain possible combinations are not described specifically. Moreover, the different embodiments of the present invention can be combined as needed, as long as the combinations do not deviate from the spirit of the present invention. However, such combinations shall also be deemed as falling into the scope of the present invention.

Hence, although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A heating circuit for a battery comprising a first battery and a second battery, the heating circuit comprising a first switch unit, a second switch unit, a first damping component, a second damping component, a first current storage component, a second current storage component, a switching control module and a charge storage component, wherein:

the first battery, the first damping component, the first current storage component, the first switch unit and the charge storage component are connected in a first loop to form a first charging/discharging circuit;

the second battery, the second damping component, the second current storage component, the charge storage component and the second switch unit are connected in a second loop to form a second charging/discharging circuit;

when the charge storage component is charged or discharges, a direction of a charging/discharging current in the second charging/discharging circuit is reverse to a direction of a charging/discharging current in the first charging/discharging circuit;

the switching control module is electrically connected with the first switch unit and the second switch unit, and the switching control module is configured to control the first switch unit and the second switch unit to switch on in alternate, so as to control electric energy flow among the first battery, the charge storage component and the second battery.

2. The heating circuit according to claim 1, wherein the first damping component and the second damping component are parasitic resistances in the first battery and the second battery respectively, the first current storage component and the second current storage component are parasitic inductances in the first battery and the second battery respectively, and the charge storage component is a capacitor.

3. The heating circuit according to claim 1, wherein the heating circuit further comprises a third current storage component and a fourth current storage component, wherein:

the third current storage component is connected in series in the first charging/discharging circuit, and the fourth current storage component is connected in series in the second charging/discharging circuit.

4. The heating circuit according to claim 3, wherein the third current storage component and the fourth current storage component are inductors.

5. A heating circuit for a battery comprising a first battery and a second battery, the heating circuit comprising a first switch unit, a second switch unit, a first damping component, a second damping component, a first current storage component, a second current storage component, a switching control module, a charge storage component, a third current storage component, a fourth current storage component, a first one-way semiconductor component, a second one-way semiconductor component, a third one-way semiconductor component and a fourth one-way semiconductor component, wherein:

the first battery, the first damping component, the first current storage component, the first switch unit and the charge storage component are connected in a first loop to form a first charging/discharging circuit;

the second battery, the second damping component, the second current storage component, the charge storage component and the second switch unit are connected in a second loop to form a second charging/discharging circuit;

when the charge storage component is charged or discharges, a direction of a charging/discharging current in the second charging/discharging circuit is reverse to a direction of a charging/discharging current in the first charging/discharging circuit;

the switching control module is electrically connected with the first switch unit and the second switch unit, and the switching control module is configured to control the first switch unit and the second switch unit to switch on in alternate, so as to control electric energy flow among the first battery, the charge storage component and the second battery;

the third one-way semiconductor component and the first switch unit are connected in series with each other and the first one-way semiconductor component and the third current storage component connected in series with each other are connected in parallel between the ends of the third one-way semiconductor component and the first switch unit, so as to limit the current in the first charging/discharging circuit in a reverse direction; and, the fourth one-way semiconductor component and the second switch unit are connected in series with each other and the fourth current storage component and the second one-way semiconductor component connected in series with each other are connected in parallel between the ends of the fourth one-way semiconductor component and the second switch unit, so as to limit the current in the second charging/discharging circuit in a reverse direction.

6. The heating circuit according to claim 5, wherein the third current storage component and fourth current storage component are inductors.

7. The heating circuit according to claim 1, wherein the first switch unit and/or the second switch unit comprise a switch and a one-way semiconductor component connected in parallel with the switch in a reverse direction, the switching control module is electrically connected with the switch, and the switching control module is configured to control ON/OFF of forward direction branches of the first switch unit and/or the second switch unit by controlling ON/OFF of the switch.

8. The heating circuit according to claim 7, wherein when or after the current flowing through the first switch unit or the second switch unit reaches zero, the switching control module is configured to control the first switch unit or the second switch unit to switch off respectively.

* * * * *